United States Patent [19]

Robinson et al.

[11] Patent Number: 5,029,041
[45] Date of Patent: Jul. 2, 1991

[54] ELECTROSTATIC DISCHARGE PROTECTION FOR A PRINTED CIRCUIT BOARD

[75] Inventors: Ronald C. Robinson; Ronald G. Field, both of London, Canada

[73] Assignee: Northern Telecom Limited, Montreal, Canada

[21] Appl. No.: 401,298

[22] Filed: Aug. 31, 1989

[51] Int. Cl.[5] .......................... H05F 3/02; H05F 3/04
[52] U.S. Cl. .................................. 361/220; 361/212; 379/437
[58] Field of Search ............... 361/111, 117, 129, 212, 361/220, 222; 307/147; 174/2, 3, 5 R, 5 SG, 126.1, 127, 250; 379/429, 437, 451

[56] References Cited

U.S. PATENT DOCUMENTS

| | | | |
|---|---|---|---|
| 3,676,742 | 7/1972 | Russell et al. | 361/56 |
| 4,473,755 | 9/1984 | Imai et al. | 307/10.1 |
| 4,531,176 | 7/1985 | Beecher | 361/424 |
| 4,532,419 | 7/1985 | Takeda | 235/492 |
| 4,591,945 | 5/1986 | Ugon | 361/212 |
| 4,667,266 | 5/1987 | Masuoka et al. | 361/212 |
| 4,750,081 | 6/1988 | Zhang | 361/220 |
| 4,821,320 | 4/1989 | Andert et al. | 379/437 |

Primary Examiner—A. D. Pellinen
Assistant Examiner—David Osborn
Attorney, Agent, or Firm—John E. Mowle

[57] ABSTRACT

A printed circuit path, which connects to a reference potential point, is provided along a portion, or more, of a printed circuit board (PCB) assembly which requires protection from electrostatic discharge (ESD). This printed circuit board path has a plurality of intentionally pointed protrusion integrally formed along its length and which point preferably toward the direction from which the electrostatic discharge is likely to approach the printed circuit board assembly; i.e. through housing mating edges or housing surface openings. The pointed conductor path is locate closer to the ESD regions of concern than other circuit paths or component solder pads. The pointed protrusion preferentially attract electrostatic discharges to itself rather than allow the discharges to strike other paths or components further in on the PCB assembly, thereby avoiding component damage.

6 Claims, 1 Drawing Sheet

ELECTROSTATIC DISCHARGE PROTECTION FOR A PRINTED CIRCUIT BOARD

FIELD OF THE INVENTION

The present invention relates generally to electrostatic discharge protection of electronic circuits. More specifically, the present invention relates to electrostatic discharge protection for a printed circuit board.

BACKGROUND OF THE INVENTION

In general, products containing printed circuit board (PCB) assemblies must be protected from electrostatic discharge (ESD), which results, in some cases, from a user's natural electrostatic charge build up and consequent discharge with touching of the product housing near an opening. Electrostatic discharge protection is necessary to prevent, or to reduce, damage to the sensitive components on the PCB assembly. Damage resulting from an electrostatic discharge may range from a brief intermittent fault to a catastrophic fault wherein the circuit is no longer capable of functioning. Standards have been set by the International Electrotechnical Commission to ensure proper protection against electrostatic discharge within electronic components. One such standard requires that telephone sets be made to withstand an electrostatic discharge of 15,000 volts. Typically this high-energy ESD is capable of destroying solid-state components in the telephone set.

Many methods of preventing electrostatic discharge from occurring exist in the prior art. One method is to position the telephone set's PCB perimeter far enough in from the walls of the plastic housing of the telephone set so that a 15,000 volt electrostatic discharge at the plastic housing cannot jump from the plastic housing to the printed circuit board. Positioning a PCB in such a manner creates an air gap which by virtue of its length prevents an electrostatic discharge from arcing, up to a given kilovolt level dependent on the size of the air gap. However, positioning a PCB in such a manner is not always possible as an objective in telephone design is to make the set as physically small as possible so that it takes up a minimum amount of space on a desk or table, and so that it is aesthetically pleasing.

Another method is to increase the ESD jump distance, and hence the ESD voltage maximum, by having an internal plastic barricade molded as part of the plastic housing. This forces any ESD to arc a greater distance than it otherwise would and thus prevents an arc from initiating at a given voltage level.

A further method is to put an insulated cover or sleeving over the region of concern which effectively increases the available arc jump distance.

Yet another method is to suspend, or otherwise locate, a wire, soldered to the electrostatic ground at one end, from the PCB much like a lightening arrestor so that it will attract ESD at a particularly sensitive location to prevent it from getting further into the circuitry.

While all of the above methods are effective, they each can add to the complexity of the design of the telephone set or necessitate that the telephone set be made larger to accommodate the electrostatic discharge protection.

Information regarding the state of the prior art may be found in the following references: U.S. Pat. No. 4,821,320 issued Apr. 11, 1989 in the name of T. J. Andert et al.; U.S. Pat. No. 4,667,266 issued May 19, 1987 in the name of Masuoka et al.; U.S. Pat. No. 4,532,419 issued July 30, 1985 in the name of M. Takeda; and U.S. Pat. No. 4,531,176 issued July 23, 1985 in the name of R. L. Beecher.

SUMMARY OF THE INVENTION

The present invention provides a simple, effective, and inexpensive way of preventing electrostatic discharge from entering further into the circuitry while not increasing the size or complexity of a surrounding housing. The present invention uses a PCB conductor path, connected to a source of reference potential, which is placed near the perimeter of the PCB adjacent to a probable housing mating edge breakdown region or at a region of the PCB near an opening in the housing, as for example where a button or the like may protrude. By so placing such a conductor path, the electrostatic discharge tends to jump to this path. To prevent the possibility of the ESD jumping past the perimeter conductor path, the conductor path is designed so as to have pointed, or nearly pointed, protrusions extending from the path at intermittent locations. The protrusions act like lighting rods by using the principle that an electrostatic discharge is more likely to jump to sharp objects than to smooth objects. In other words, the protrusions attract the ESD, thereby preventing the ESD from striking elsewhere on the PCB.

Stated in other terms the present invention is a method of reducing electrostatic discharge damage to a printed circuit board, the method comprising the steps of: providing at least one conductor path connected to a source of reference potential, the at least one conductor path placed along at least one portion of at least one edge of the printed circuit board; and, providing a plurality of approximately pointed protrusions along the length of the at least one conductor path, each of said protrusions being an integral part of said at least one conductor path and having a base approximately equal to the width of said at least one conductor path and an apex approximately half of the width of said at least one conductor path from said base; wherein each of said plurality of approximately pointed protrusions has its apex near said at least one edge of said printed circuit board and wherein each of said plurality of approximately pointed protrusions is nearer to said at least one edge than any other conductor on said printed circuit board.

Stated in yet other terms the present invention is a printed circuit board, the printed circuit board being formed from a dielectric substrate and having thereon a plurality of conductor paths for interconnecting electrical components thereon, the printed circuit board comprising: at least one conductor path for connection to a source of reference potential, for providing protection against electrostatic discharge, the at least one conductor path placed along at least one portion of at least one edge of the printed circuit board; the at least one conductor path having formed therewith a plurality of approximately pointed protrusions along the length of the at least one conductor path, each of said protrusions being an integral part of said at least one conductor path and having a base approximately equal to the width of said at least one conductor path and an apex approximately half of the width of said at least one conductor path from said base; wherein each of said plurality of approximately pointed protrusions has its apex near said at least one edge of said printed circuit board and wherein each of said plurality of approximately pointed protrusions is nearer to said at least one edge than any other conductor on said printed circuit board.

BRIEF DESCRIPTION OF THE DRAWINGS

The invention will be readily understood by the following description of a preferred embodiment, by way of example, in conjunction with the accompanying diagrammatic drawings, in which.

DETAILED DESCRIPTION OF THE INVENTION

Figure 1:
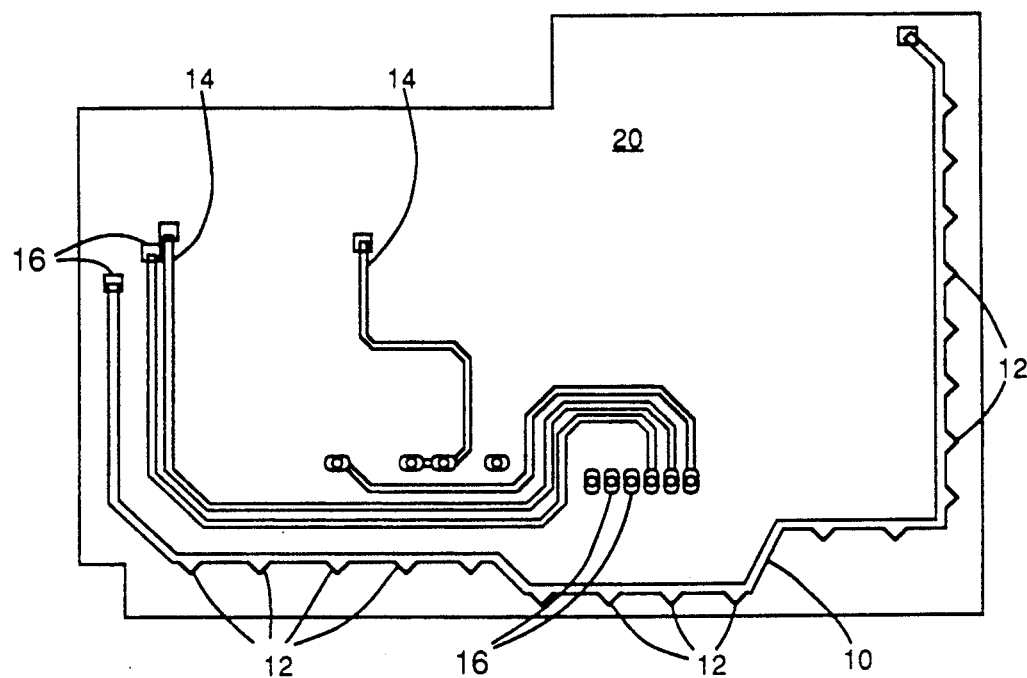
FIG. 1 is a top plan view of a printed circuit board incorporating the present invention.

FIG. 1 illustrates a printed circuit board 20 having a plurality of conductor paths 14. Conductor paths 14 are provided to interconnect electrical circuitry (not shown) affixed to the PCB 20 via lands 16. According to the present invention, placed along a portion of the perimeter of the PCB 20 is an electrostatic discharge conductor path 10 which is connected to a source of reference potential (not shown). The conductor path 10 is placed along the perimeter of the PCB 20 so as to act as a direct path for any electrostatic discharge which may occur around the parting line of a plastic housing encasing the PCB 20. The conductor path 10 is not covered or coated with insulating solder resist thereby facilitating a conductive path for an electrostatic discharge. In practice, the conductor path 10 need only be placed along the edge, or edges, of the PCB 20 nearest the region of the plastic housing that will result in an electrostatic discharge breakdown, thereby reducing the area needed to accommodate the conductor path 10 and consequently leaving more room for other conductor paths 14 on the PCB 20.

Figure 2:
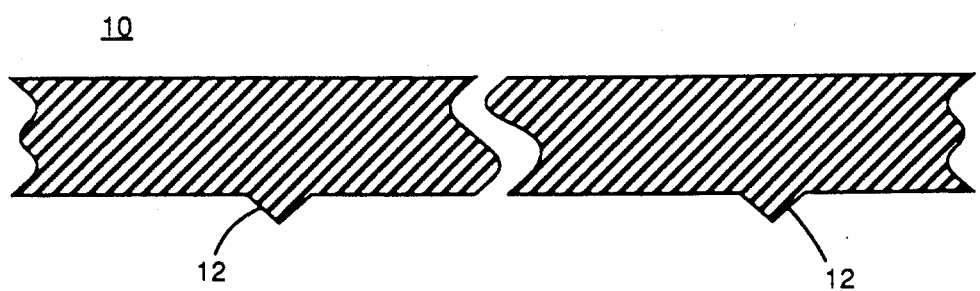
FIG. 2 is a partial top plan view of an electrostatic discharge conductor path according to the present invention.

To ensure that an electrostatic discharge will not jump over the conductor path 10, pointed, or nearly pointed, protrusions 12 (further illustrated in FIG. 2) are placed along the length of the conductor path 10. The apexes of the protrusions 12 are placed towards the edge or edges of the PCB 20 and extend beyond any other conductor paths 14 or lands 16 that may appear on the edges of the PCB 20. The protrusions 12 provide a sharp edge which attracts an electrostatic discharge onto conductor path 10.

It can be noted that the protrusions 12 may be regularly or irregularly spaced along the length of conductor path 10. The determination as to the location of the protrusions 12 will depend on the amount of protection required at a particular location on PCB 20.

The protrusions need not be specifically shaped as shown in the Figures; they could be rectangular protrusions, or regular and/or irregular pointed configurations protruding along the length of the at least one conductor path. The distinguishing feature of the protrusion is its sharp or nearly-sharp points preferably pointing towards the direction from which the ESD might enter the PCB, as for example through the mating edges of the housing pieces. The size of the protrusions are in general controlled by the amount of available space on the PCB and the acceptable closeness of them to the ESD entry regions In a preferred embodiment, the width of the conductor path 10 is approximately 0.02 inches. Each of the protrusions 12 has a base of approximately 0.02 inches and an apex approximately 0.01 inches from the conductor path 10.

The present invention provides a simple yet relatively effective method of reducing electrostatic discharge damage to components on a printed circuit board.

Numerous other modifications, variations, and adaptations may be made to the particular embodiments of the invention described above without departing from the scope of the claims.

What is claimed is:

1. A method of reducing electrostatic discharge damage to a printed circuit board, said method comprising the steps of:
    providing at least one conductor path connected to a source of reference potential, said at least one conductor path placed along at least one portion of at least one edge of said printed circuit board; and,
    providing a plurality of approximately pointed protrusions along the length of said at least one conductor path, each of said protrusions being an integral part of said at least one conductor path and having a base approximately equal to the width of said at least one conductor path and an apex approximately half of the width of said at least one conductor path from said base;
    wherein each of said plurality of approximately pointed protrusions has its apex near said at least one edge of said printed circuit board and wherein each of said plurality of approximately pointed protrusions is nearer to said at least one edge than any other conductor on said printed circuit board.

2. A method of reducing electrostatic discharge damage to a printed circuit board as claimed in claim 1 wherein said plurality of approximately pointed protrusions are approximately equidistantly spaced.

3. A printed circuit board, said printed circuit board being formed from a dielectric substrate and having thereon a plurality of conductor paths for interconnecting electrical components thereon, said printed circuit board comprising:
    at least one conductor path for connection to a source of reference potential, for providing protection against electrostatic discharge, said at least one conductor path placed along at least one portion of at least one edge of said printed circuit board;
    said at least one conductor path having formed therewith a plurality of approximately pointed protrusions along the length of said at least one conductor path, each of said protrusions being an integral part of said at least one conductor path and having a base approximately equal to the width of said at least one conductor path and an apex approximately half of the width of said at least one conductor path from said base;
    wherein each of said plurality of approximately pointed protrusions has its apex near said at least one edge of said printed circuit board and wherein each of said plurality of approximately pointed protrusions is nearer to said at least one edge than any other conductor on said printed circuit board.

4. A printed circuit board as claimed in claim 3 wherein said plurality of protrusions are approximately equidistantly spaced.

5. A printed circuit board as claimed in claim 3 wherein said plurality of approximately pointed protrusions are placed at locations along said conductor path where electrostatic discharge will occur.

6. A printed circuit board, said printed circuit board being formed from a dielectric substrate and having thereon a plurality of conductor paths for interconnecting electrical components thereon, said printed circuit board comprising:
- at least one conductor path for connection to a source of reference potential, for providing protection against electrostatic discharge, said at least one conductor path placed along at least one portion of at least one edge of said printed circuit board;
- said at least one conductor path having formed therewith a plurality of approximately pointed protrusions along the length of said at least one conductor path, the protrusions being integrally formed therewith;
- wherein said at least one conductor path is approximately 0.02 inches in width and each of said approximately pointed protrusions has a base of approximately of 0.02 inches and an apex approximately 0.01 inches from said conductor path;
- wherein each of said plurality of approximately pointed protrusions has its apex near said at least one edge of said printed circuit board and wherein each of said plurality of approximately pointed protrusions is nearer to said at least one edge than any other conductor on said printed circuit board.

* * * * *